(12) United States Patent
Lee

(10) Patent No.: US 7,049,225 B2
(45) Date of Patent: May 23, 2006

(54) METHOD FOR MANUFACTURING VIAS BETWEEN CONDUCTIVE PATTERNS UTILIZING ETCHING MASK PATTERNS FORMED ON THE CONDUCTIVE PATTERNS

(75) Inventor: Ju-Bum Lee, Hawsung-gun (KR)

(73) Assignee: Sumsung Electronics Co., Ltd., Gyeonggi-do (KR)

( * ) Notice: Subject to any disclaimer, the term of this patent is extended or adjusted under 35 U.S.C. 154(b) by 25 days.

(21) Appl. No.: 10/782,783

(22) Filed: Feb. 23, 2004

(65) Prior Publication Data
US 2004/0166667 A1 Aug. 26, 2004

(30) Foreign Application Priority Data
Feb. 22, 2003 (KR) .................. 10-2003-0011225

(51) Int. Cl.
*H01L 21/4763* (2006.01)
(52) U.S. Cl. .................. 438/637; 438/586; 438/634
(58) Field of Classification Search ................ 438/597, 438/618, 621–622, 637, 586, 631, 633
See application file for complete search history.

(56) References Cited

U.S. PATENT DOCUMENTS

| | | | |
|---|---|---|---|
| 6,184,079 B1 * | 2/2001 | Lee ............................ 438/253 |
| 6,204,161 B1 * | 3/2001 | Chung et al. ............... 438/612 |
| 6,221,777 B1 * | 4/2001 | Singh et al. ................ 438/692 |
| 6,255,168 B1 * | 7/2001 | Gau ............................ 438/262 |
| 6,368,957 B1 * | 4/2002 | Horio .......................... 438/634 |
| 6,573,168 B1 * | 6/2003 | Kim et al. ................... 438/586 |
| 6,723,597 B1 * | 4/2004 | Abbott et al. ............... 438/238 |
| 6,797,611 B1 * | 9/2004 | Wu et al. .................... 438/637 |
| 6,808,975 B1 * | 10/2004 | Song et al. ................. 438/233 |
| 6,870,268 B1 * | 3/2005 | Lee et al. .................... 257/774 |
| 2001/0012673 A1 * | 8/2001 | Gyu-chul .................... 438/373 |
| 2002/0109171 A1 * | 8/2002 | Lee ............................ 257/296 |
| 2003/0008469 A1 * | 1/2003 | Hwang et al. .............. 438/396 |
| 2003/0015732 A1 * | 1/2003 | Park ........................... 257/200 |
| 2003/0114007 A1 * | 6/2003 | Park ........................... 438/694 |
| 2004/0058522 A1 * | 3/2004 | Lee et al. .................... 438/618 |
| 2004/0127013 A1 * | 7/2004 | Wu et al. .................... 438/618 |
| 2005/0032358 A1 * | 2/2005 | Yuasa ......................... 438/637 |
| 2005/0048763 A1 * | 3/2005 | Tzou et al. ................. 438/622 |

* cited by examiner

*Primary Examiner*—Anh Duy Mai
(74) *Attorney, Agent, or Firm*—Volentine Francos & Whitt, PLLC

(57) ABSTRACT

In a manufacture of a semiconductor device, spacers are formed on sidewalls of structures including conductive patterns and insulation patterns. The insulation patterns are at least four times thinner than the conductive patterns. After gaps between the structures are filled with a first insulation film, etch stop film patterns having a width which is wider than that of the structures are formed on the structures. A second insulation film is formed to cover the resultant structures without voids between the structures.

19 Claims, 17 Drawing Sheets

200 220 200 220

METHOD FOR MANUFACTURING VIAS BETWEEN CONDUCTIVE PATTERNS UTILIZING ETCHING MASK PATTERNS FORMED ON THE CONDUCTIVE PATTERNS

BACKGROUND OF THE INVENTION

1. Field of the Invention

The present invention relates to a method for manufacturing a semiconductor device, and more particularly, the present invention relates to a method for manufacturing a semiconductor device to minimize the formation of defects such as voids.

A claim of priority under 35 USC § 119 is made to Korean Patent Application 2003-11225, filed on Feb. 22, 2003, the contents of which are herein incorporated by reference in their entirety for all purposes.

2. Description of the Related Art

As semiconductor devices have become increasingly integrated, the conductive patterns of the devices have become narrower and more closely spaced. Generally, the narrow patterns are contained in multi-layered structures in which interlayer dielectrics (or insulating interlayers) are used to electrically insulate adjacent patterns from each other, and in which contacts or vias are formed in the interlayer dielectrics to electrically connect upper and lower patterns. Each contact or via is formed by creating an opening through the interlayer dielectric (or the insulating interlayer) and by filling the opening with a conductive material.

In order to reliably form the vias or contacts, the interlayer dielectric should be uniform and dense and completely occupy the space between adjacent patterns. That is, the interlayer dielectric should be free of voids. However, as the design rule of the semiconductor device and the spacing between patterns are reduced, the interlayer dielectric must be formed in spaces having higher aspect ratios. This makes it difficult to form the interlayer dielectric without voids.

Additionally, in a semiconductor device having a size of less than about 100 nm, the pattern may be damaged while the interlayer dielectric in a narrow area between the patterns is etched to form a contact hole. Hence, a thick hard mask is used to protect the pattern when the interlayer dielectric is etched using a self-aligned contact (SAC) process. As a result, the aspect ratio of the portion between the patterns is further increased as a result of the presence of the hard mask.

A high density plasma enhanced chemical vapor deposition (HDP-CVD) process has been used to fill gaps having a high aspect ratio. However, in the case where the design rule of the semiconductor device has a critical dimension (CD) of less than about 0.2 μm, i.e. about 0.18 μm, the HDP-CVD process can result in the formation of voids or seams in the filled gaps.

Recently, a boro-phosphor silicate glass (BPSG) film has been adopted as an insulation film used to fill minute gaps. In this case, the BPSG film is formed and thermally treated to enhance a gap filling capacity thereof or to improve a flatness thereof. U.S. Pat. No. 6,368,957 (issued to Takuji Horio et. al.) discloses an example of a method for forming an insulation film using BPSG.

However, the method of using a BPSG film may not result in complete filling of a minute gap when the design rule of the semiconductor device is substantially reduced. The gap fill characteristic of the BPSG film can be enhanced by increasing the concentration of dopants such as boron (B), phosphorus (P), etc., but the resultant BPSG film may be easily etched during a wet etching process so that the BPSG film may not be sufficiently formed between adjacent contact holes. As a result, a bridge between adjacent contacts may occur so that a failure such as an electrical short of the semiconductor device may result when the contacts are formed.

FIG. 2 is a scanning electron microscopic image illustrating a semiconductor device in the case where an insulation film is generally formed employing a conventional gap filling process. When openings between conductive patterns 200 have aspect ratios of about 16:1, voids 220 are formed between the conductive patterns 200 after the insulation film is filled up in gaps between the conductive patterns 200. The voids 220 are formed even though the insulation film is formed by a re-flow process using BPSG having an excellent gap filling characteristic. After contacts are formed through the insulation film using conductive materials, bridges may be formed between the contacts, thereby causing electrical shorts between the contacts.

SUMMARY OF THE INVENTION

According to one aspect of the present invention, first spacers are formed on sidewalls of first structures formed on a semiconductor device, where the first structures include conductive patterns and insulation patterns. Here, each insulation pattern has a thickness which is at least four time less than a thickness of each conductive pattern. After a first insulation film is formed to cover the first structures including the first spacers, first insulation film patterns are formed by planarizing the first insulation film until upper faces of the first structures are exposed. Second structures are formed on the first insulation film patterns and on the first structures in order to expose first portions of the first insulation film patterns. The first portions are separated from the first structures by a distance of about 5 to about 35 percent of intervals between the first structures. Then, openings which expose portions of the semiconductor substrate are formed by etching the first portions of the first insulation film patterns using the second structures and the first spacers as etching masks.

According to another aspect of the present invention, first spacers are formed on sidewalls of first structures formed on a semiconductor device, where the first structures include conductive patterns and insulation patterns. In this case, the conductive pattern has a first width and each insulation pattern has a thickness which is at least four times less than a thickness of each conductive pattern. After a first insulation film is formed to cover the first structures including the first spacers, first insulation film patterns are formed by planarizing the first insulation film until upper faces of the first structures are exposed. Second structures are formed on the first structures to expose first portions of the first insulation film patterns. At this time, the second structures have second widths extended in a horizontal direction by a distance of about 5 to about 35 percent of intervals between the first structures. After a second insulation film is formed to fill gaps between the second structures, openings which expose portions of the semiconductor substrate are formed by partially etching portions of the second insulation film and successively etching the first portions of the first insulation film patterns using the second structures and the first spacers as etching masks.

BRIEF DESCRIPTION OF THE DRAWINGS

The above and other aspects of the present invention will become readily apparent from the detailed description that follows, with reference to the accompanying drawings, in which.

DETAILED DESCRIPTION OF THE PREFERRED EMBODIMENTS

Figure 1:
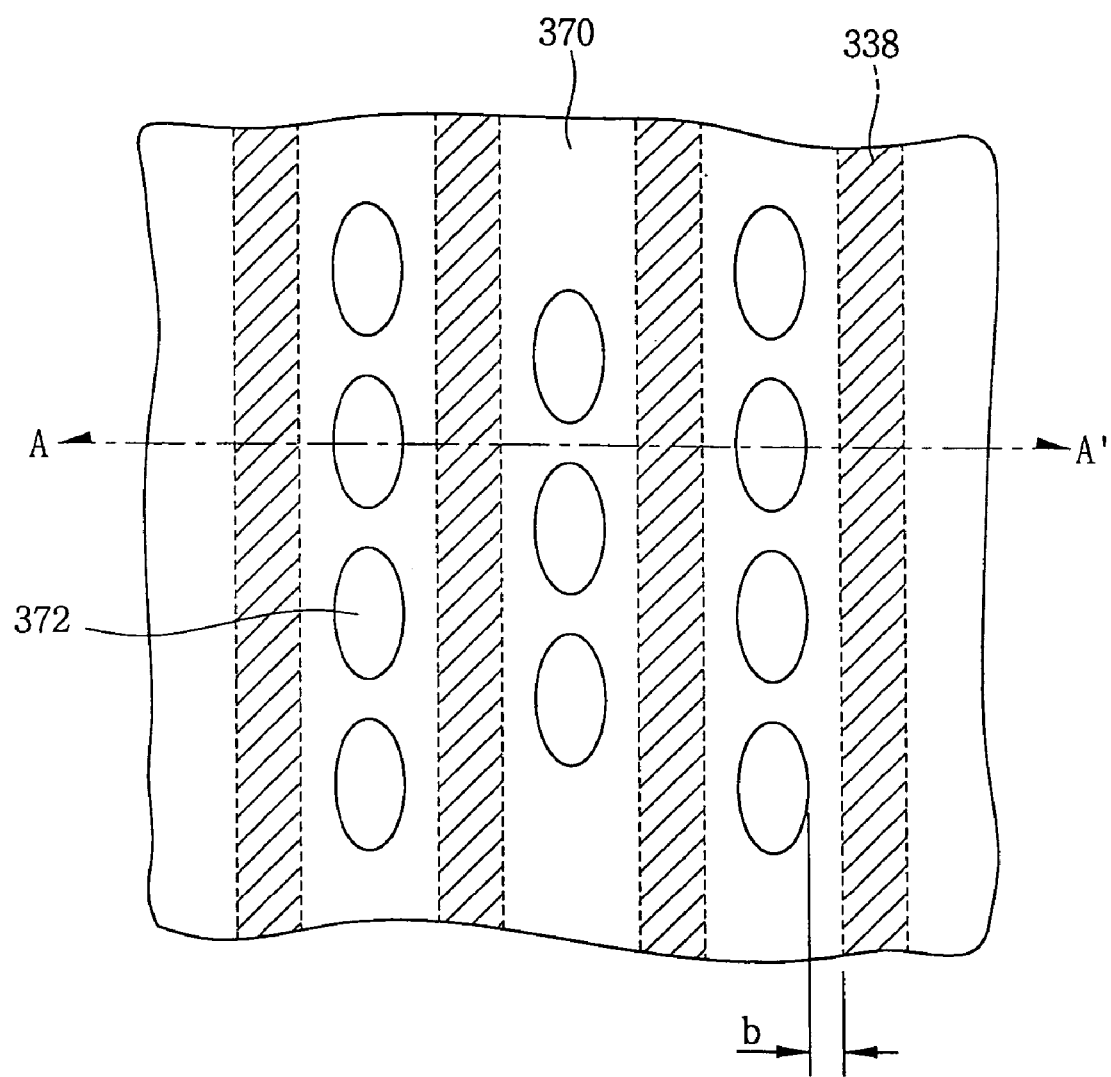
FIG. 1 is a plane view illustrating a semiconductor device according to one embodiment of the present invention.
Figure 2:
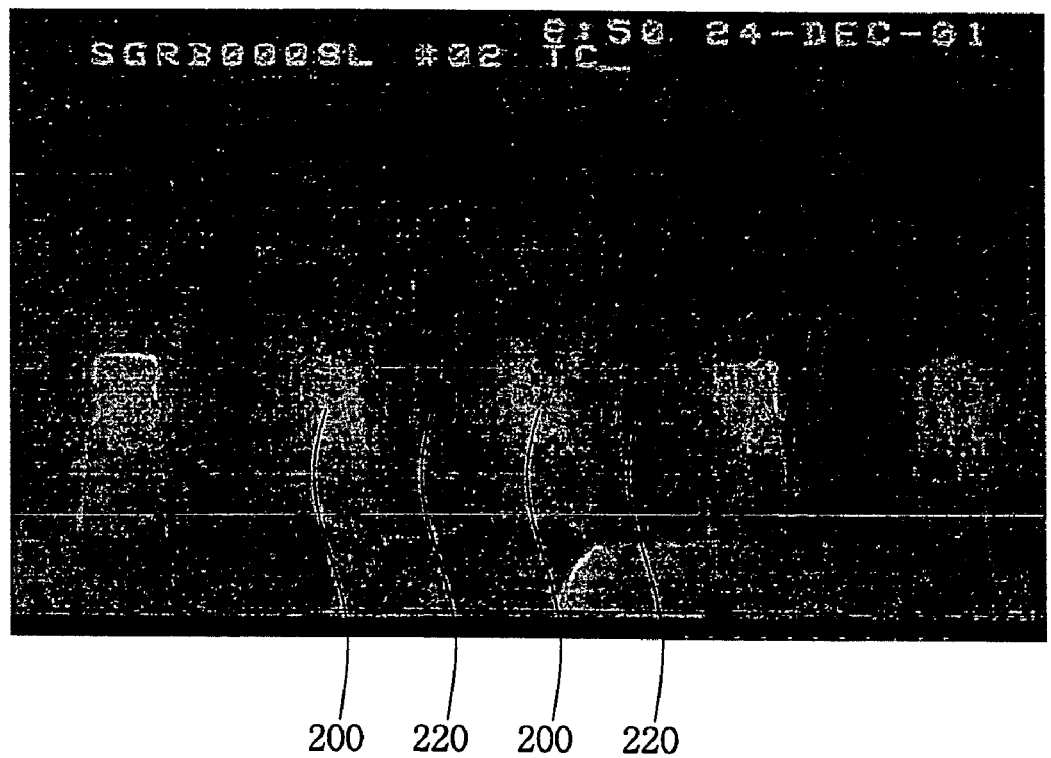
FIG. 2 is a scanning electron microscope image illustrating a conventional semiconductor device.

Hereinafter, the preferred embodiments of the present invention will be described in detail with reference to the accompanying drawings. In the drawings, like reference numerals identify similar or identical elements.

FIG. 1 is a plan view illustrating a semiconductor device which is manufactured according to one embodiment of the present invention.

Referring to FIG. 1, a plurality of gate lines (that is, gate electrodes) 338 is formed on a semiconductor substrate, and insulation films are formed between the gate lines 338. Etch stop film patterns 370 are formed on the gate lines 338 and on the insulation films, respectively. Each of the etch stop film patterns 370 partially exposes portions between the gate lines 338. Openings 372 are formed between the gate lines 338 by etching the insulation films using the etch stop film patterns 370 as an etching mask.

FIGS. 3A to 3H are cross-sectional views illustrating a method for manufacturing the semiconductor device taken along a line of A–A' in FIG. 1.

Figure 3A:
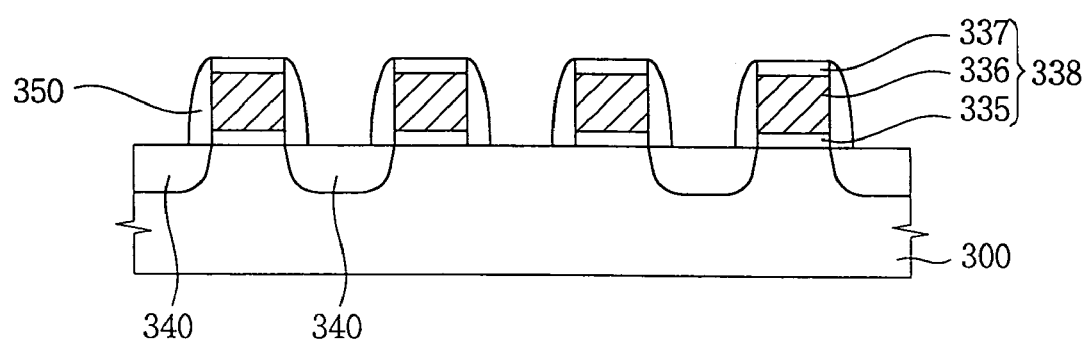
FIGS. 3A to 3H are cross-sectional views illustrating a method for manufacturing the semiconductor device taken along a line of A–A' in FIG. 1.

Referring to FIG. 3A, an active region and a field region are defined on a semiconductor substrate 300 using an isolation process such as a shallow trench isolation (STI) process.

After an oxide film is formed on the semiconductor substrate 300 including the active and the field regions, a polysilicon film is formed on the oxide film. The polysilicon film is highly doped with impurities, and an insulation film is formed on the doped polysilicon film.

The insulation film, the doped polysilicon film and the oxide film are successively patterned using a photolithography process to form gate electrodes 338 including insulation film patterns 337, doped polysilicon film patterns 336 and gate oxide film patterns 335, respectively. At this time, a thickness of the insulation film pattern 337 is more than four times thinner than that of the doped polysilicon film pattern 336. Namely, a thickness ratio between the insulation film pattern 337 and the doped polysilicon film pattern 336 is more than about 1:4. If the thickness ratio between the insulation film pattern 337 and the doped polysilicon film pattern 336 is less than about 1:4, a thickness of the gate electrode 338 increases to augment an aspect ratio of a region between the gate electrodes 338. As a result, the region (that is, a gap between the gate electrodes 338) may not be completely filled during a successive process and a void may be generated in the gap.

Source/drain regions 340 are formed on portions of the semiconductor substrate 300 between the gate electrodes 338 using an ion implantation process. Hence, transistors are formed including the gate electrodes 338 and the source/drain regions 340 on the semiconductor substrate 300.

After an insulation material is deposited on the gate electrodes 338 and on the semiconductor substrate 300, the insulation material is anisotropically etched to form spacers 350 on sidewalls of the gate electrodes 338, respectively. The spacers 350 may include silicon nitride or silicon oxide.

Figure 3B:
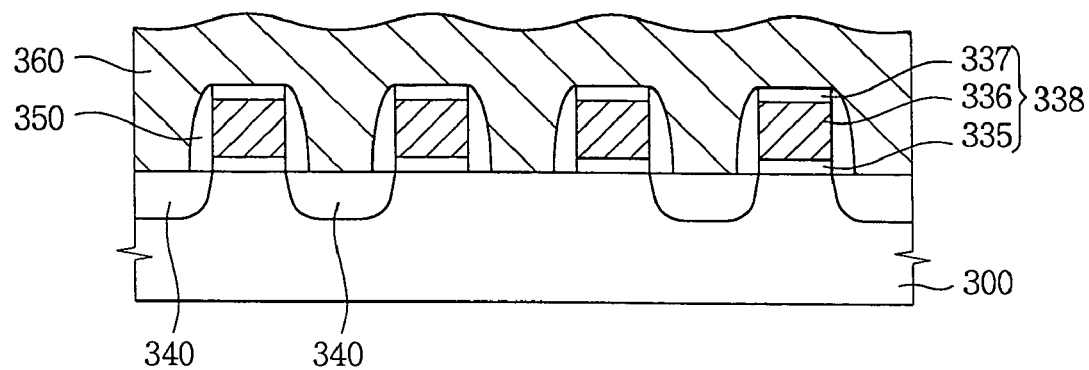

Referring to FIG. 3B, BPSG is coated on the semiconductor substrate 300 to fill the gaps between the gate electrodes 338, and the BPSG is re-flowed to form an insulation film 360 on the gate electrodes 338 and on the semiconductor substrate 300.

The gate electrode includes an etch stop film pattern which is sufficiently thick in consideration of a successive etching process. In a conventional process, the thick etch stop film pattern can cause the gap between the gate electrodes to become too deep to be completely filled with an insulation film. However, according to the present embodiment, the gap between the gate electrodes 338 is relatively shallow because the gate electrode 338 includes the relatively thin insulation film pattern 337. As a result, the aspect ratio of the gap between the gate electrodes 338 is reduced to less than about 10:1, thereby preventing the formation of a void in the insulation film 360. The insulation film 360 may also include a high density plasma (HDP) oxide, a high temperature undoped silicate glass (HTUSG) or a spin-on-dielectric (SOD) material.

Figure 3C:
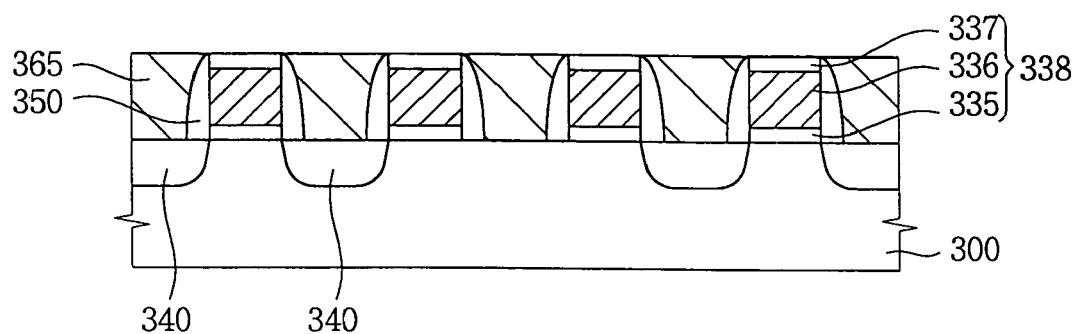

Referring to FIG. 3C, the insulation film 360 is planarized using a chemical mechanical polishing (CMP) process or an etch back process until upper faces of the gate electrodes 338 are exposed in order to form insulation film patterns 365 between the gate electrodes 338. In this case, the insulation film pattern 337 of the gate electrode 338 serves as an etching end point during the formation of the insulation film pattern 365.

Figure 3D:
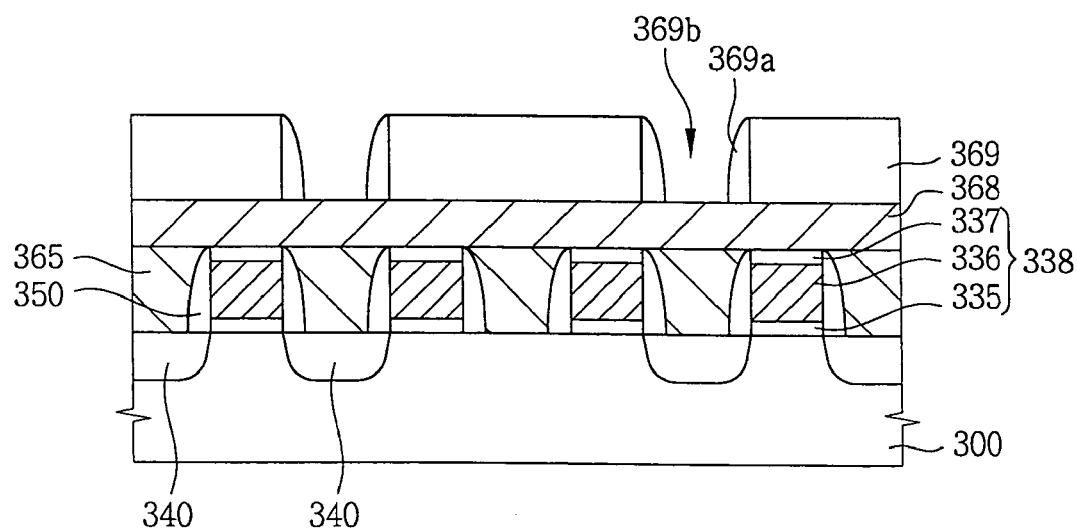

Referring to FIG. 3D, an etch stop film 368 is formed on the insulation film patterns 365 and on the gate electrodes 338. Hard mask patterns 369 are formed on the etch stop film 368. At this time, the hard mask patterns 369 are positioned over the gate electrodes 338 while exposing the insulation film patterns 365 located between the gate electrodes 338. Intervals between the hard mask patterns 369 are equal to or greater than intervals between the gate electrodes 338.

After an insulation film is uniformly coated on the hard mask patterns 369 and on the etch stop film 368, the insulation film is anisotropically etched to form hard mask spacers 369a on sidewalls of the hard mask patterns 369, respectively. In this case, a thickness of the hard mask spacer 369a is adjusted in accordance with a thickness of the insulation film such that a first region 369b having a dimension which is smaller than a critical dimension (CD) of the semiconductor device is exposed between the hard mask patterns 369.

Figure 3E:
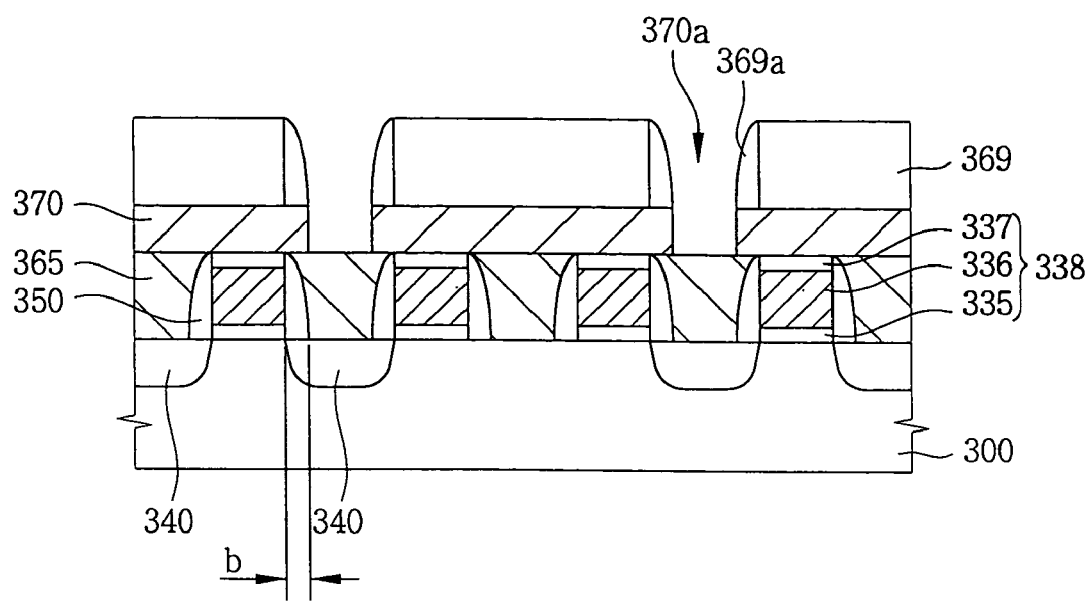

Referring to FIG. 3E, portions of the etch stop film 368 corresponding to the first regions 369b are etched using the hard mask patterns 369 and the hard mask spacers 369a. Thus, etch stop film patterns 370 are formed to expose second regions 370a positioned over the insulation film patterns 365 between the gate electrodes 338.

The second region 370a is separated from the gate electrode 338 by an interval b corresponding to about 5 to 35 percent of the interval between the gate electrodes 338. If the interval b is less than about 5 percent of the interval between the gate electrodes 338, the etch stop film pattern 370 may be etched during a successive etching process so that the underlying gate electrode 338 may be exposed and damaged. If the interval b is more than about 35 percent of the interval between the gate electrodes 338, the insulation film pattern 365 between the gate electrodes 338 may not be exposed such that the etching process may be inadequately performed.

Figure 3F:
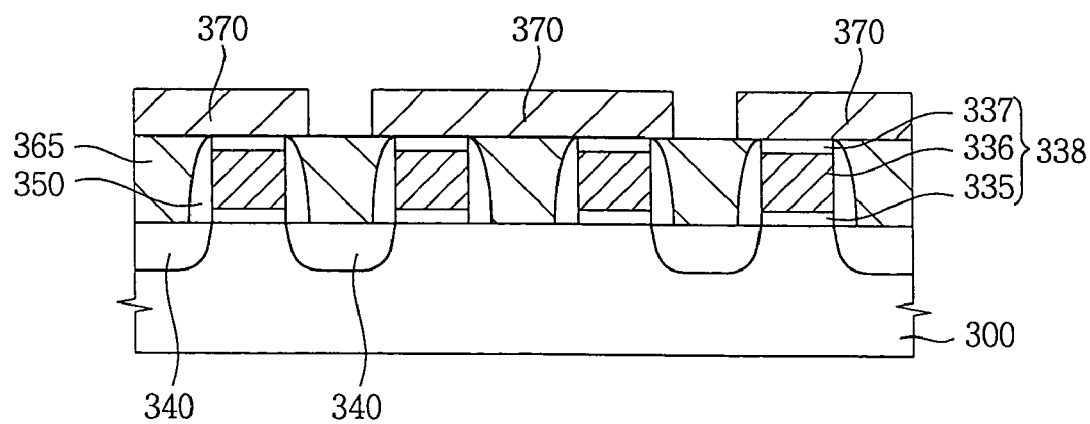

Referring to FIG. 3F, the hard mask spacers 369a and the hard mask patterns 369 are removed from the etch stop film patterns 370.

Figure 3G:
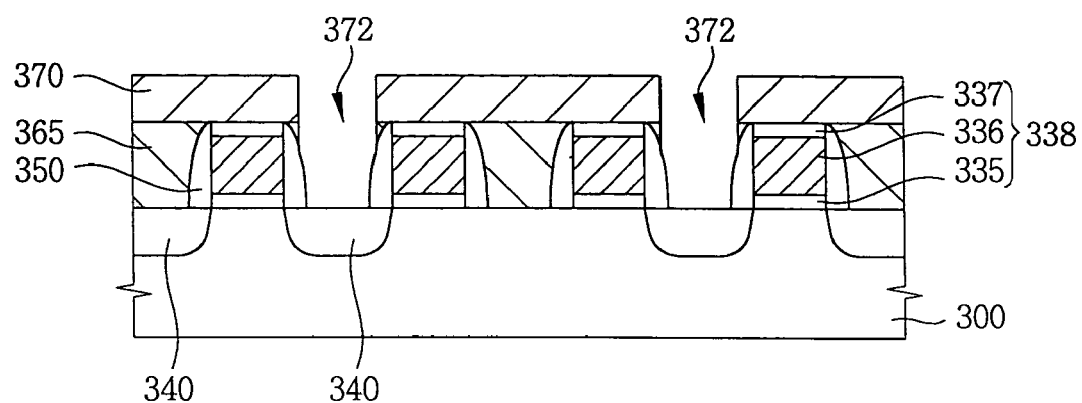

Referring to FIG. 3G, the insulation film patterns 365 between the gate electrodes 338 are etched using the etch stop film patterns 370 as etching masks, thereby forming openings 372 between the gate electrodes 338, respectively.

In an etching process for forming the openings 372, the insulation film pattern 365 has an etching selectivity of more than about 10:1 relative to the etch stop film pattern 370 and to the gate spacer 350. If the etching selectivity is less than about 10:1, the etch stop film pattern 370 and the gate spacer 350 may be over-etched during etching of the insulation film pattern 365 so that the gate electrode 338 may be exposed and damaged. Thus, the insulation film pattern 365 preferably has the etching selectivity of more than about 10:1 relative to the etch stop film pattern 370 and to the gate spacer 350.

Figure 3H:
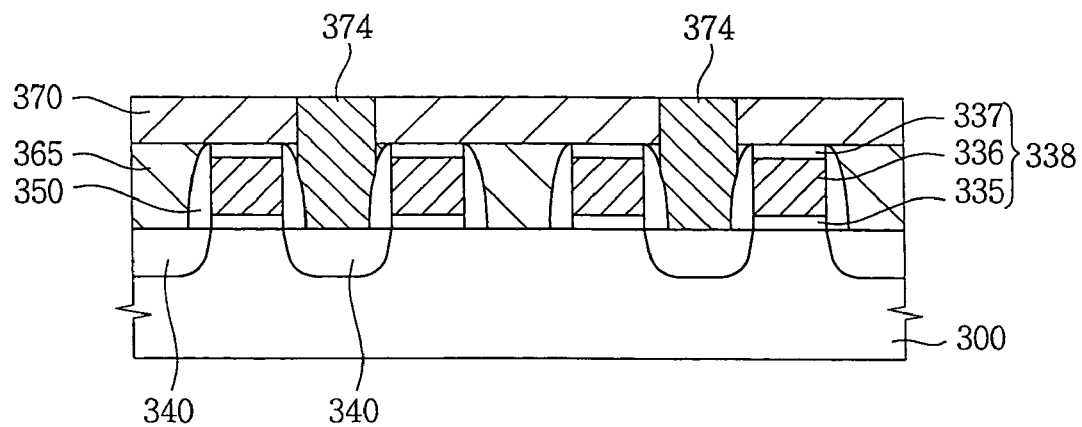

Referring to FIG. 3H, after a conductive film is formed to fill up the openings 372 and is planarized using a CMP process, self-aligned contact (SAC) pads 374 are formed, respectively.

According to the above-described method for forming the semiconductor device, conductive wirings like SAC pads can be completely formed in the gaps without defects such as voids since the insulation film or the conductive film can completely fill up the gaps between the gate electrodes having relatively low heights. The processes of the present embodiment can be advantageously employed for forming a conductive wiring like a bit line.

Figure 4:
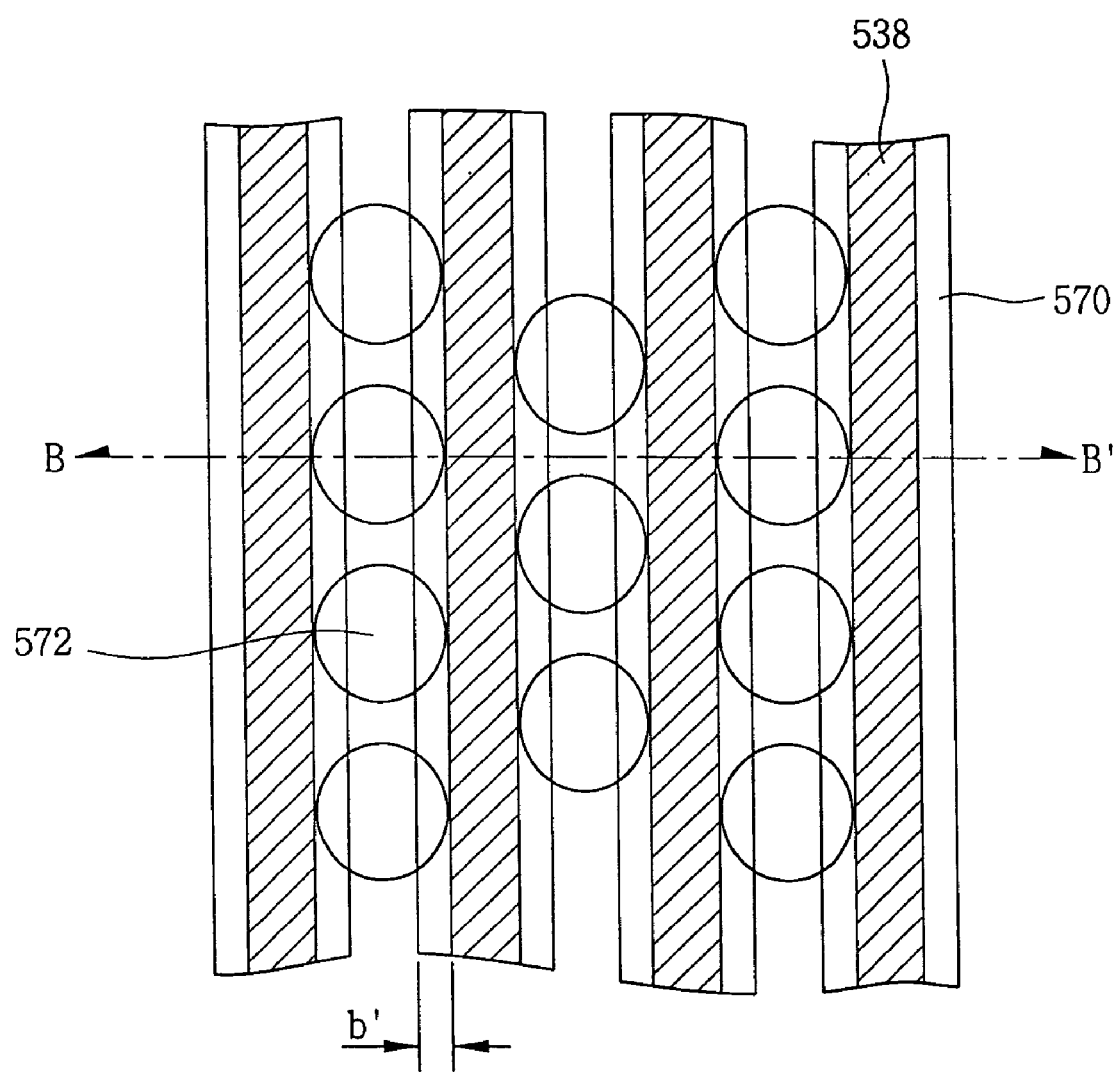
FIG. 4 is a plane view illustrating a semiconductor device according to another embodiment of the present invention.

FIG. 4 is a plan view illustrating a semiconductor device according to another embodiment of the present invention. Referring to FIG. 4, a plurality of gate. lines (gate electrodes) 538 are formed on a semiconductor substrate, and insulation films are formed between the gate lines 538. Etch stop film patterns 570 are formed on the gate lines 538 and on the insulation films, respectively. The etch stop film pattern 570 partially exposes a portion between the gate lines 538. Openings 572 are formed between the gate lines 538 by etching the insulation films using the etch stop film patterns 570 as etching masks.

FIGS. 5A to 5I are cross-sectional views illustrating a method for manufacturing the semiconductor device taken along a line of B–B' in FIG. 4.

Figure 5A:
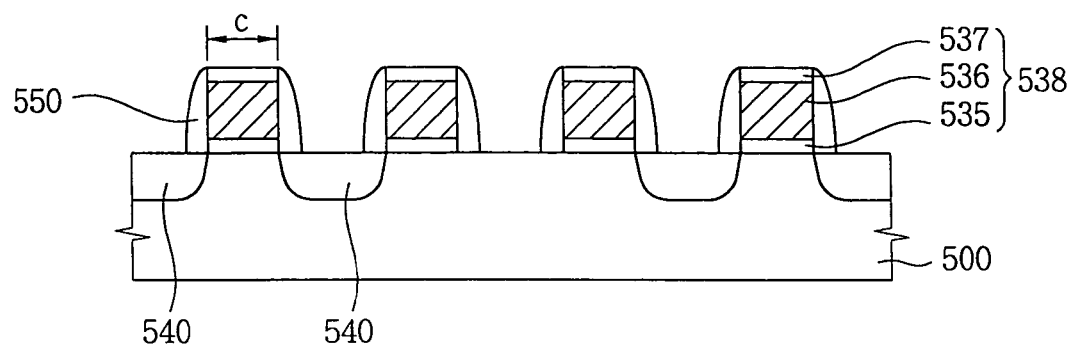
FIGS. 5A to 5I are cross-sectional views illustrating a method for manufacturing the semiconductor device taken along a line of B–B' in FIG. 4.

Referring to FIG. 5A, an active region and a field region are defined on a semiconductor substrate 500 using an isolation process such as an STI process.

After an oxide film is formed on the semiconductor substrate 500 including the active and the field regions, a polysilicon film is formed on the oxide film. The polysilicon film is highly doped with impurities, and an insulation film is formed on the doped polysilicon film.

The insulation film, the doped polysilicon film and the oxide film are successively etched using a photolithography process to form gate electrodes 538 including insulation film patterns 537, doped polysilicon film patterns 536 and gate oxide film patterns 535, respectively. The gate electrode 538 has a first width c. At this time, at thickness of the insulation film pattern 537 is at least four times thinner than that of the doped polysilicon film pattern 536. That is, a thickness ratio between the insulation film pattern 537 and the doped polysilicon film pattern 536 is more than about 1:4. If the thickness ratio between the insulation film pattern 537 and the doped polysilicon film pattern 536 is less than about 1:4, a thickness of the gate electrode 538 increases to augment an aspect ratio of a region between the gate electrodes 538. As a result, the region (that is, a gap between the gate electrodes 538) may not be completely filled during a successive process and a void may be generated in the gap.

Source/drain regions 540 are formed at surface portions of the semiconductor substrate 500 between the gate electrodes 538 using an ion implantation process. Thus, transistors are formed including the gate electrodes 538 and the source/drain regions 540 on the semiconductor substrate 500.

After an insulation material is deposited on the gate electrodes 538 and on the semiconductor substrate 500, the insulation material is anisotropically etched to form spacers 550 on sidewalls of the gate electrodes 538, respectively. The spacers 550 may include silicon nitride or silicon oxide.

Figure 5B:
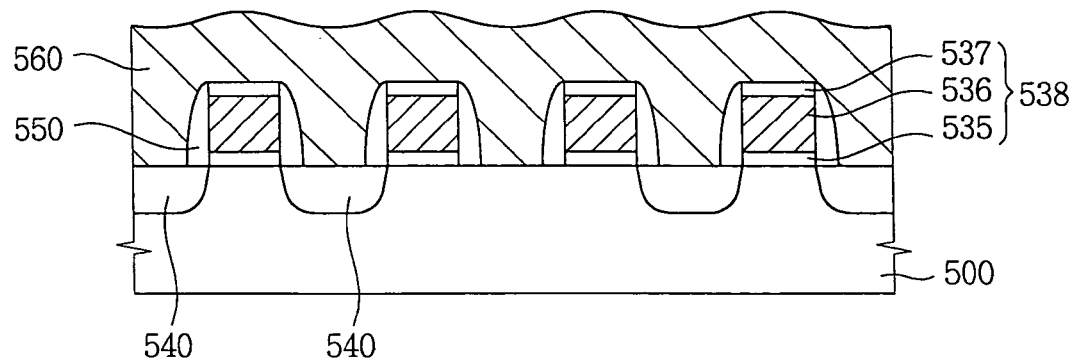

Referring to FIG. 5B, BPSG is coated on the semiconductor substrate 500 to fill up the gaps between the gate electrodes 538, and the BPSG is re-flowed to form a first insulation film 560 on the gate electrodes 538 and on the semiconductor substrate 500. The gate electrode includes an etch stop film pattern which is sufficiently thick in consideration of a successive etching process. In a conventional process, the thick etch stop film pattern can cause the gap between the gate electrodes to become too deep to be completely filled with an insulation film. However, according to the present embodiment, the gap between the gate electrodes 5338 is relatively shallow because the gate electrode 538 includes the relatively thin insulation film pattern 537. As a result, the aspect ratio of the gap between the gate electrodes 538 is reduced to less than about 10:1, thereby preventing the formation of a void in the insulation film 560. The insulation film 560 may also include a high density plasma (HDP) oxide, a high temperature undoped silicate glass (HTUSG) or a spin-on-dielectric (SOD) material.

Figure 5C:
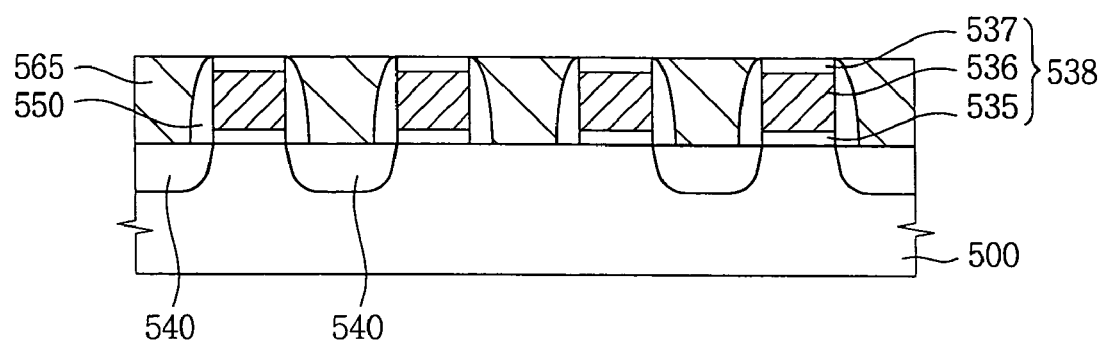

Referring to FIG. 5C, the first insulation film 560 is planarized using a CMP process or an etch back process until upper faces of the gate electrodes 538 are exposed in order to form insulation film patterns 565 between the gate electrodes 538. In this case, the insulation film pattern 537 of the gate electrode 538 serves as an etching end point during a formation of the first insulation film pattern 565.

Figure 5D:
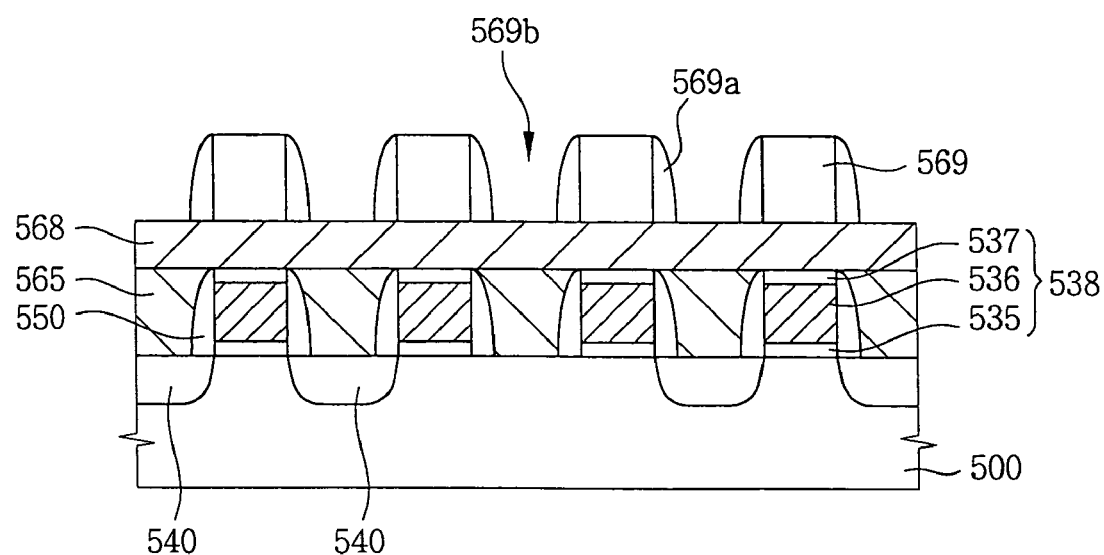

Referring to FIG. 5D, an etch stop film 568 is formed on the insulation film patterns 565 and on the gate electrodes 538. To easily etch the etch stop film 568 and to completely fill up the gaps between the gate electrodes 538, the etch stop film 568 has a thickness equal to or thinner than that of the gate electrode 538. For example, when the gate electrode 538 has a thickness of about 2000 Å, the etch stop film 568 has a thickness of about 500 to about 2000 Å. If the etch stop film 568 has a thickness of less than about 500 Å, the etch stop film 568 may not effectively serve as an etch stop layer. On the other hand, the gaps between the gate electrodes 538 may not completely filled when the etch stop film 568 has a thickness of more than about 2000 Å.

Hard mask patterns 569 are formed on the etch stop film 568. At this time, the hard mask patterns 569 are positioned over the gate electrodes 538 while exposing the first insulation film patterns 565 between the gate electrodes 538. Intervals between the hard mask patterns 569 are equal to or greater than intervals between the gate electrodes 538.

After an insulation film is uniformly coated on the hard mask patterns 569 and on the etch stop film 568, the insulation film is anisotropically etched to form hard mask spacers 569a on sidewalls of the hard mask patterns 569, respectively. At this time, a thickness of the hard mask spacer 569a is adjusted in accordance with a thickness of the insulation film such that a first region 569b having a dimension which is smaller than a CD of the semiconductor device is exposed between the hard mask patterns 569.

Figure 5E:
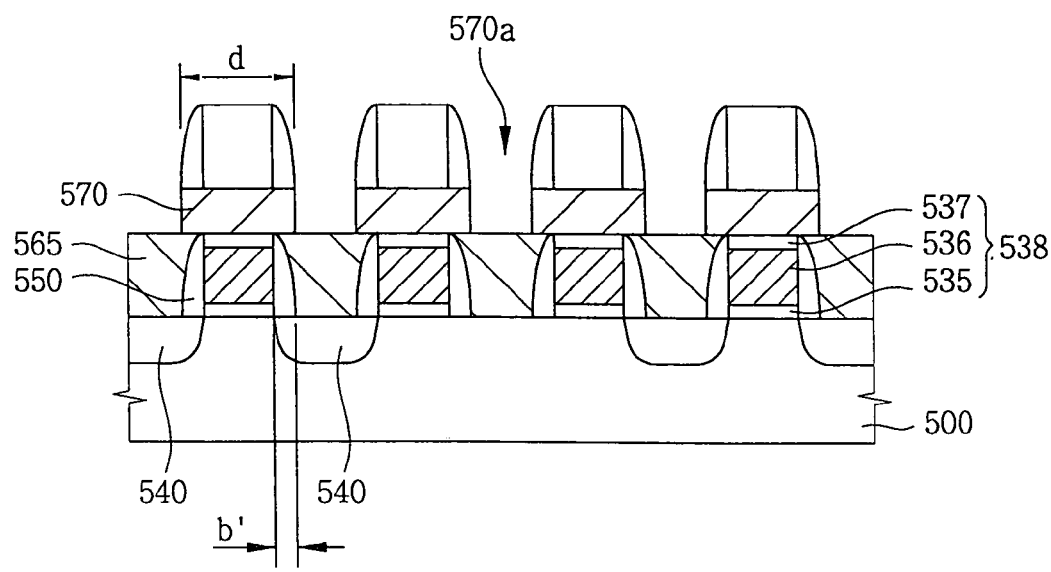

Referring to FIG. 5E, portions of the etch stop film 568 corresponding to the first regions 569b are etched using the hard mask patterns 569 and the hard mask spacers 569a. Thus, etch stop film patterns 570 are formed to expose second regions 570a positioned over the first insulation film patterns 565 between the gate electrodes 538.

The etch stop film pattern 570 has a second width d extended along horizontal directions by about 5 to about 35 percent of the interval between gate electrodes 538. Additionally, the etch stop film pattern 570 has the thickness which is less than that of the gate electrode 538.

The second width d of the etch stop film patterns 570 is wider than the first width c of the gate electrode 538 by a width b' corresponding to about 5 to about 35 percent of the interval between the gate electrodes 538. If the width b' is less than about 5 percent of the interval between the gate electrodes 538, the etch stop film pattern 570 may be etched during a successive etching process so that the underlying gate electrode 538 may be exposed and damaged. Otherwise, if the width b' is more than about 35 percent of the interval between the gate electrodes 538, the first insulation film pattern 565 between the gate electrodes 538 may not be exposed such that the etching process may ineffectively performed.

In the present embodiment, the etch stop film pattern 570 positioned on the gate electrode 538 is formed after the gap between the gate electrodes 538 is filled. The region between the gate electrodes 538 has a reduced depth resulting from a reduced thickness of the etch stop film pattern 570. Therefore, the aspect ratio of the region between the gate electrodes 538 can be reduced so that defects like voids are not formed in the region between the gate electrodes 538.

Figure 5F:
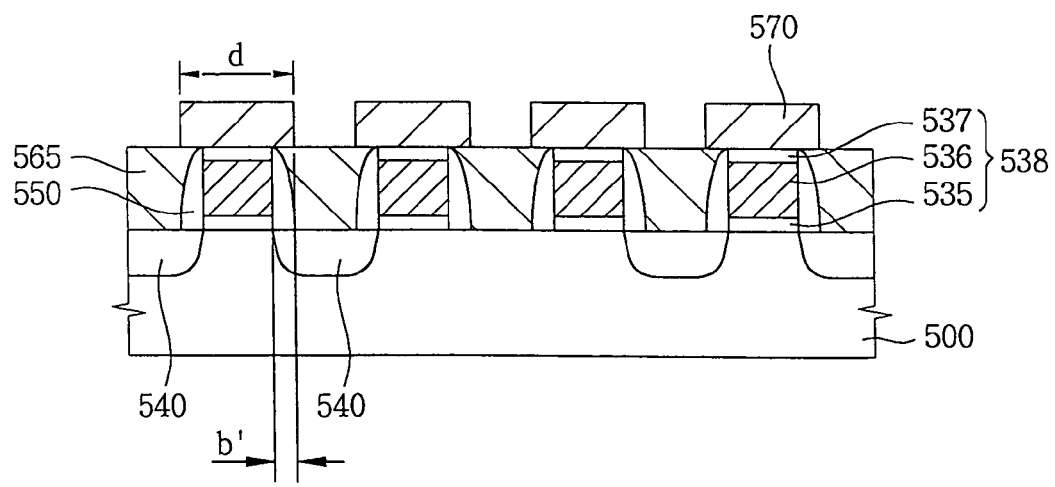

Referring to FIG. 5F, the hard mask spacers 569a and the hard mask patterns 569 are removed from the etch stop film patterns 570.

Figure 5G:
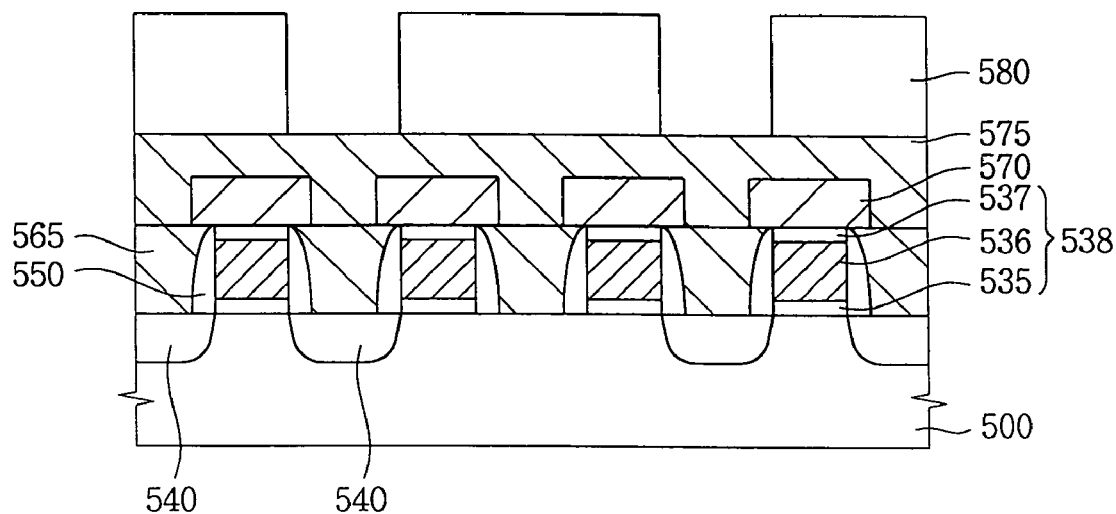

Referring to FIG. 5G, after a second insulation film 575 is formed on the first insulation film patterns 565 and on the etch stop film patterns 570, the second insulation film 575 is planarized using a CMP process. The second insulation film 575 can easily cover the etch stop film patterns 570, because the etch film pattern 570 has the thickness which is less than that of the gate electrode 538.

Photoresist patterns 580 are formed on the second insulation film 575 to expose portions of the second insulation film 575 positioned between the gate electrodes 538. The photoresist patterns 580 expose the portions of the second insulation film 575 under which portions of the etch stop film patterns 570 and the gate spacers 550 are positioned.

Figure 5H:
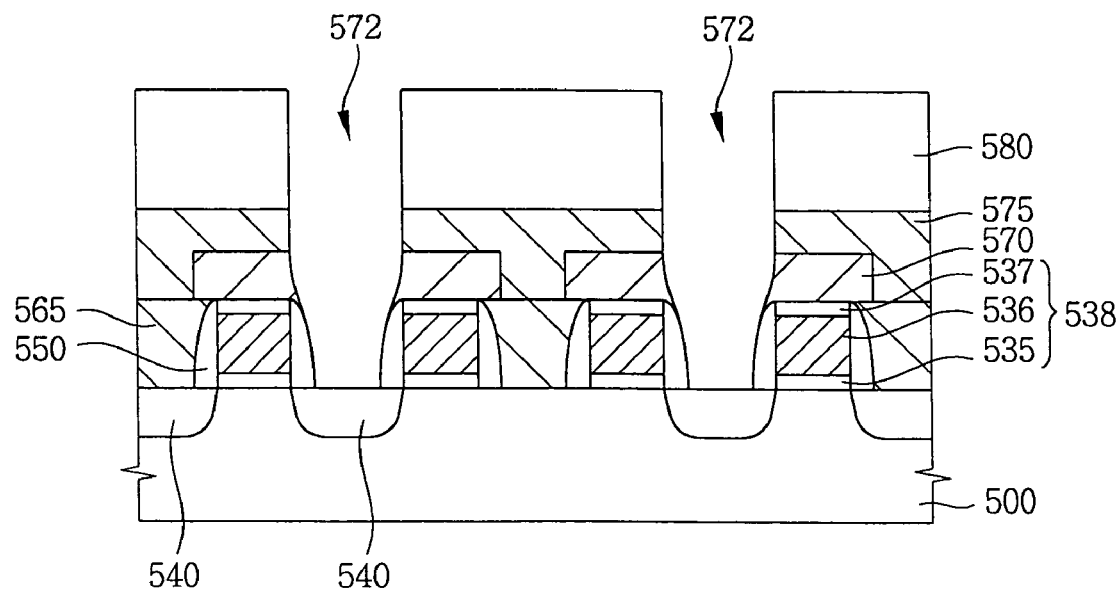

Referring to FIG. 5H, after the second insulation film 575 is etched using the photoresist patterns 580 as etching masks, the first insulation film patterns 565 are successively etched, thereby forming openings 572 between the gate electrodes 538, respectively. In an etching process for forming the openings 572, the second insulation film 575 and the first insulation film pattern 565 have an etching selectivity of more than about 10:1 relative to the etch stop film pattern 570 and to the gate spacer 550, respectively. If etching selectivity is less than about 10:1, the etch stop film pattern 570 and the gate spacer 550 may be over-etched during etching of the second insulation film 575 and the first insulation film pattern 565 so that the gate electrode 538 may be exposed and damaged. Thus, the second insulation film 575 and the first insulation film pattern 565 preferably have the etching selectivity of more than about 10:1 relative to the etch stop film pattern 570 and to the gate spacer 550.

Figure 5I:
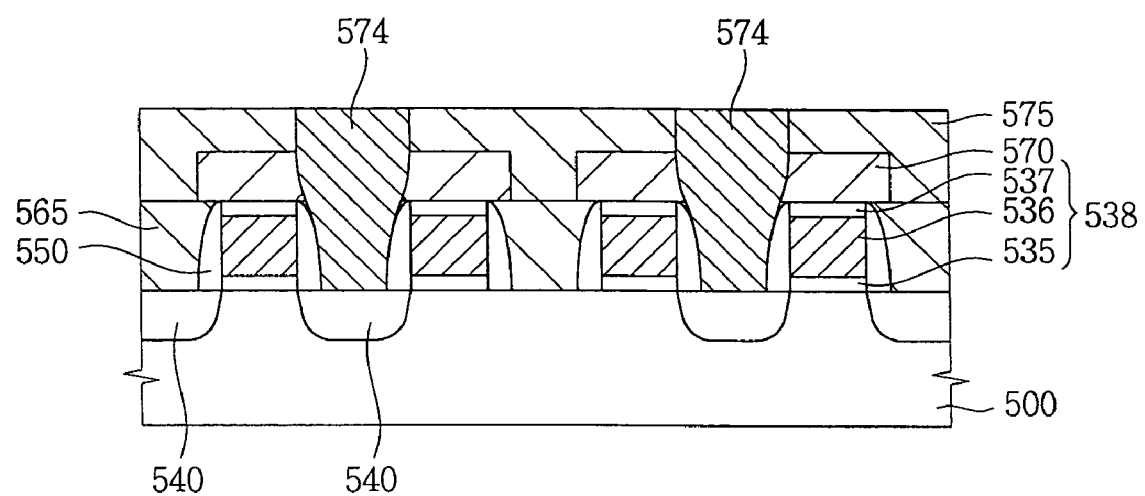

Referring to FIG. 5I, after a conductive film is formed to fill up the openings 572 and is planarized using a CMP process, SAC pads 574 are formed in the openings 572, respectively.

According to the above-described method for forming the semiconductor device, conductive wirings such as pads can be formed without defects like voids because gaps between the gate electrodes having relatively lower heights can be completely filled with insulation film or conductive film. The processes of the present embodiment can be advantageously employed for forming inter layer dielectrics between conductive wirings such as bit lines.

FIGS. 6A to 6D are cross-sectional views illustrating a method for manufacturing the semiconductor device taken along the line of A–A' in FIG. 1.

Figure 6A:
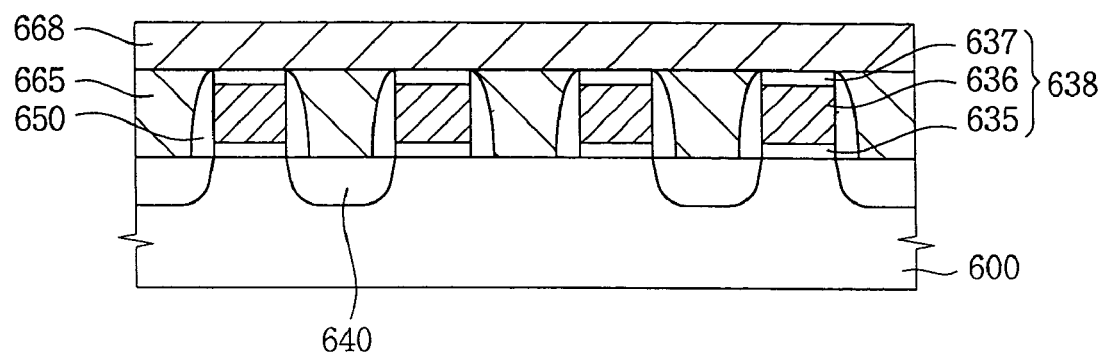
FIGS. 6A to 6D are cross-sectional views illustrating a method for manufacturing the semiconductor device taken along the line of A–A' in FIG. 1.

Referring to FIG. 6A, gate electrodes 638 are formed on a semiconductor substrate 600. Each gate electrode 638 includes a gate oxide film pattern 635, a doped polysilicon film pattern 636 and an insulation pattern 637. Source/drain regions 640 are formed on portions of the semiconductor substrate 600 between the gate electrodes 638. Thus, transistors having the gate electrodes 638 and the source/drain regions 640 are formed on the semiconductor substrate 600. At this time, the insulation pattern 637 has a thickness which is at least four times less than that of the doped polysilicon film pattern 636. Namely, a thickness ratio between the insulation pattern 637 and the doped polysilicon film pattern 636 is more than about 1:4. If the thickness ratio between the insulation film pattern 637 and the doped polysilicon film pattern 636 is less than about 1:4, a thickness of the gate electrode 638 increases to augment an aspect ratio of a region between the gate electrodes 638. As a result, the region (that is, a gap between the gate electrodes 638) may not be completely filled during a successive process and a void may be generated in the gap.

Gate spacers 650 are formed on sidewalls of the gate electrodes 638, respectively. An insulation film is formed on the gate electrodes 638 and on the semiconductor substrate 600 to fill up the gaps between the gate electrodes 638. In this case, the gap between the gate electrodes 638 is completely filled with the insulation film because the gate electrode 638 includes the thin insulation pattern 637. That is, a depth of the gap between the gate electrodes 638 is reduced so that the gap has the aspect ratio of less than about 10:1. Hence, voids are not generated in the gap when the insulation film is filled in the gap.

The insulation film is etched using the insulation pattern 637 of the gate electrode 638 as an etching end point, thereby forming insulation film patterns 665 on the portions of the semiconductor substrate 600 between the gate electrodes 638.

An etch stop film 668 is formed on the insulation film patterns 665 and on the gate electrodes 638.

Figure 6B:
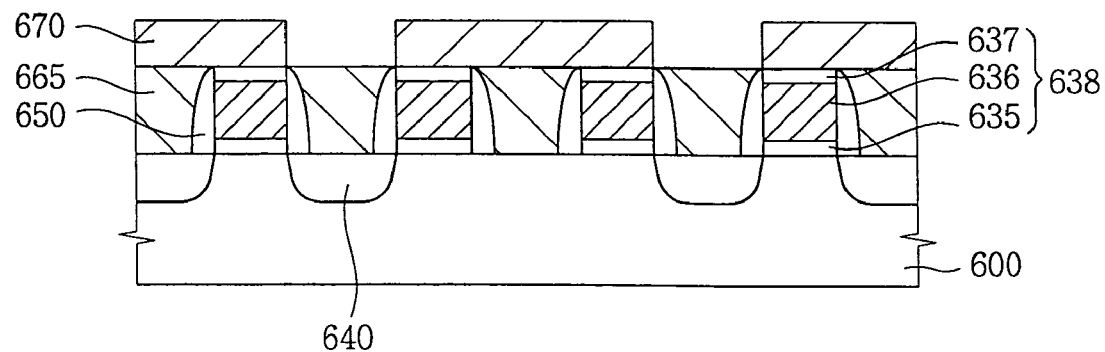

Referring to FIG. 6B, the etch stop film 668 is patterned using a photolithography process to form etch stop film patterns 670 partially exposing portions of the insulation film pattern 665 between the gate electrodes 638.

Figure 6C:
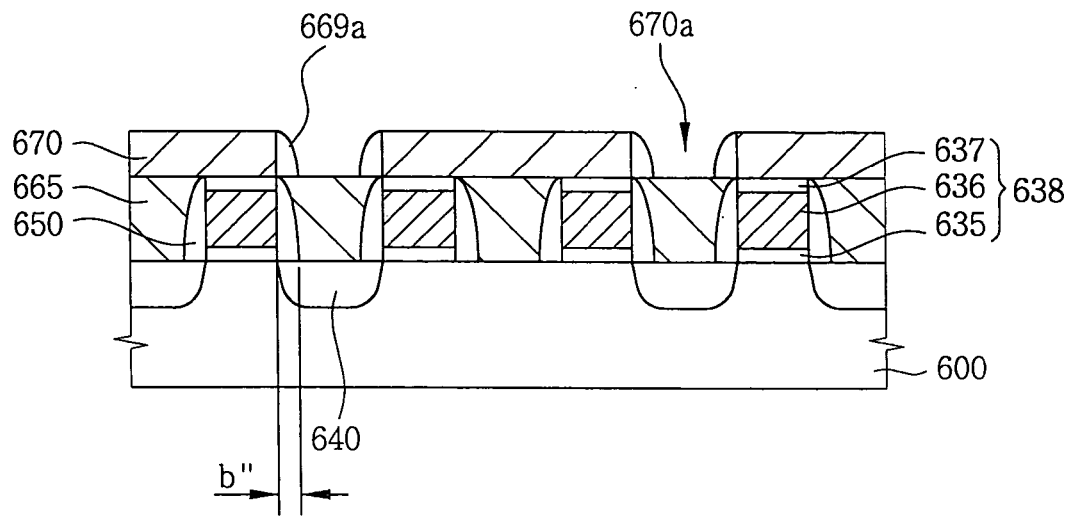

Referring to FIG. 6C, after an insulation material is uniformly coated on the etch stop film pattern 670 and on the insulation film patterns 665, the coated insulation material is anisotropically etched to form etch stop film spacers 669a on sidewalls of the etch stop film patterns 670, respectively. At this time, a thickness of the etch stop film spacer 669a is adjusted in accordance with a thickness of the coated insulation material. As a result, open regions 670a are formed between the etch stop film spacers 669a to have a dimension which is less than a CD of a semiconductor device.

The open regions 670a are separated from the gate electrode 638 by an interval b" which is about 5 to about 35 percent of an interval between the gate electrodes 638 according to controlling the thickness of the etch stop film spacer 669a.

When widths of the open regions 670a can be achieved using a photolithography process, a structure having a width as wide as entire width of the etch stop film patterns 670 and the etch stop film spacers 669a can be formed to replace with the etch stop film patterns 670 and the etch stop film spacers 669a.

Figure 6D:
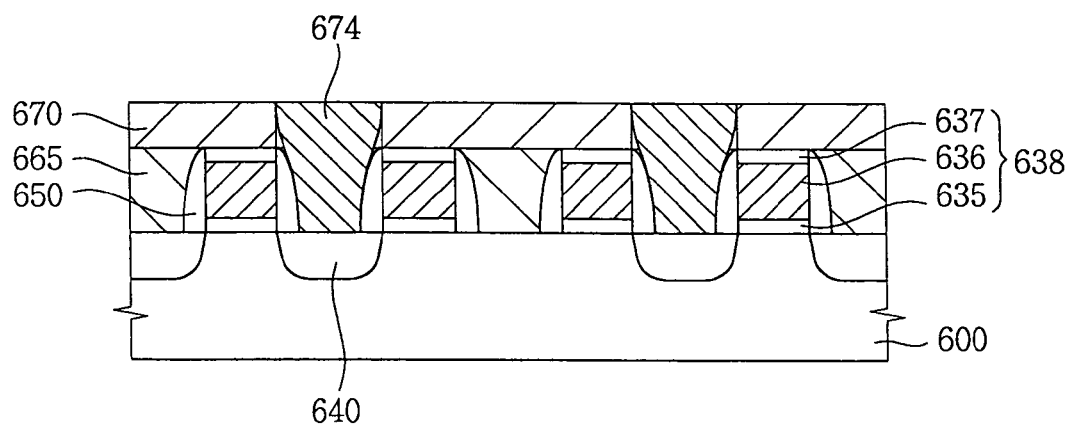

Referring to FIG. 6D, exposed portions of the insulation film patterns 665 through the openings 670a are etched using the etch stop film patterns 670 and the etch stop film spacers 669a as etching masks. Hence, openings exposing the source/drain regions 640 are formed through the insulation film patterns 665. In an etching process for forming the openings, the insulation film patterns 665 have an etching selectivity of more than about 10:1 relative to the etch stop film pattern 670, the etch stop film spacer 669a and the gate spacer 650.

After the openings are filled with a conductive film, the conductive film is planarized using a CMP process to form SAC pads 647 in the openings, respectively.

The method of the present embodiment can be advantageously employed for forming conductive wirings such as bit lines of a semiconductor device. The conductive wirings can be easily formed in gaps without generations of defects such as voids.

FIGS. 7A to 7E are cross-sectional views illustrating a method for manufacturing the semiconductor device taken along the line of B–B' in FIG. 4.

Figure 7A:
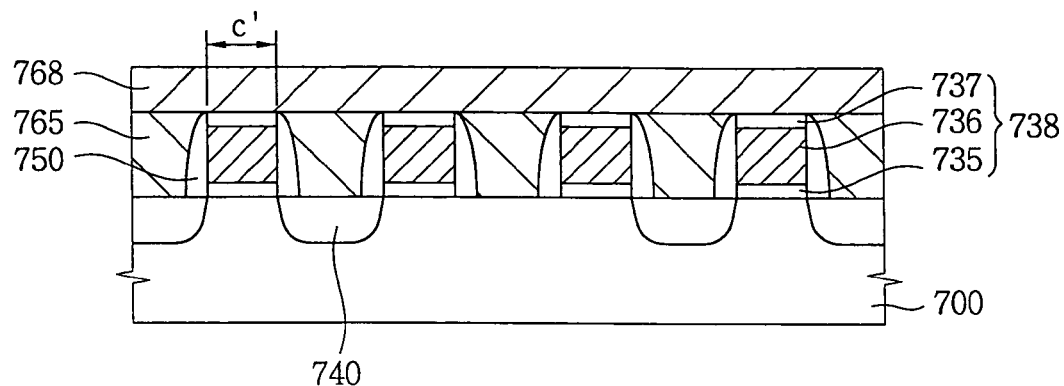
FIGS. 7A to 7E are cross-sectional views illustrating a method for manufacturing the semiconductor device taken along the line of B–B' in FIG. 4.

Referring to FIG. 7A, gate electrodes 738 having first widths c' are formed on a semiconductor substrate 700. Each of the gate electrodes 738 includes a gate oxide film pattern 735, a doped polysilicon film pattern 736 and an insulation pattern 737. Source/drain regions 740 are formed on portions of the semiconductor substrate 700 between the gate electrodes 738. Hence, transistors having the gate electrodes 738 and the source/drain regions 740 are formed on the semiconductor substrate 700. At this time, the insulation pattern 737 has a thickness which is at least four times thinner than that of the doped polysilicon film pattern 736. Namely, a thickness ratio between the insulation pattern 737 and the doped polysilicon film pattern 736 is more than about 1:4. If the thickness ratio between the insulation pattern 737 and the doped polysilicon film pattern 736 is less than about 1:4, a thickness of the gate electrode 738 increases to augment an aspect ratio of a region between the gate electrodes 738. As a result, the region (that is, a gap between the gate electrodes 738) may not be completely filled during a successive process and a void may be generated in the gap.

After gate spacers 750 are formed on sidewalls of the gate electrodes 738, a first insulation film is formed on the gate electrodes 738 and on the semiconductor substrate 700 to fill up the gaps between the gate electrodes 738. In this case, the gaps between the gate electrodes 738 are completely filled with the first insulation film because the gate electrodes 738 include the thin insulation patterns 737. That is, depths of the gaps between the gate electrodes 738 are reduced so that the gaps have the aspect ratios of less than about 10:1. Hence, voids are not generated in the gaps when the first insulation film is filled in the gaps.

The first insulation film is etched using the insulation patterns 737 of the gate electrodes 738 as etching end points, thereby forming first insulation film patterns 765 on the portions of the semiconductor substrate 700 between the gate electrodes 738.

An etch stop film 768 is formed on the first insulation film patterns 765 and on the gate electrodes 738. In order to easily etch the etch stop film 768 and to completely fill up the gaps between the gate electrodes 738, the etch stop film 768 has a thickness which is equal to or less than that of the gate electrode 738. For example, when the gate electrode 738 has a thickness of about 2000 Å, the etch stop film 768 has a thickness of about 500 to about 2000 Å. If the etch stop film 768 has a thickness of less than about 500 Å, the etch stop film 768 may not effectively serve as an etch stop layer. On the other hand, the gaps between the gate electrodes 738 may not completely filled when the etch stop film 768 has a thickness of more than about 2000 Å.

Figure 7B:
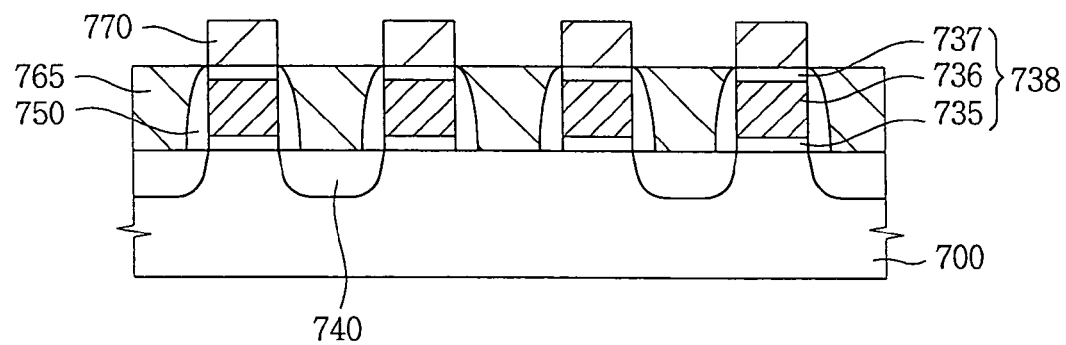

Referring to FIG. 7B, the etch stop film 768 is patterned using a photolithography process to form etch stop film patterns 770 exposing portions of the first insulation film pattern 765 between the gate electrodes 738.

Figure 7C:
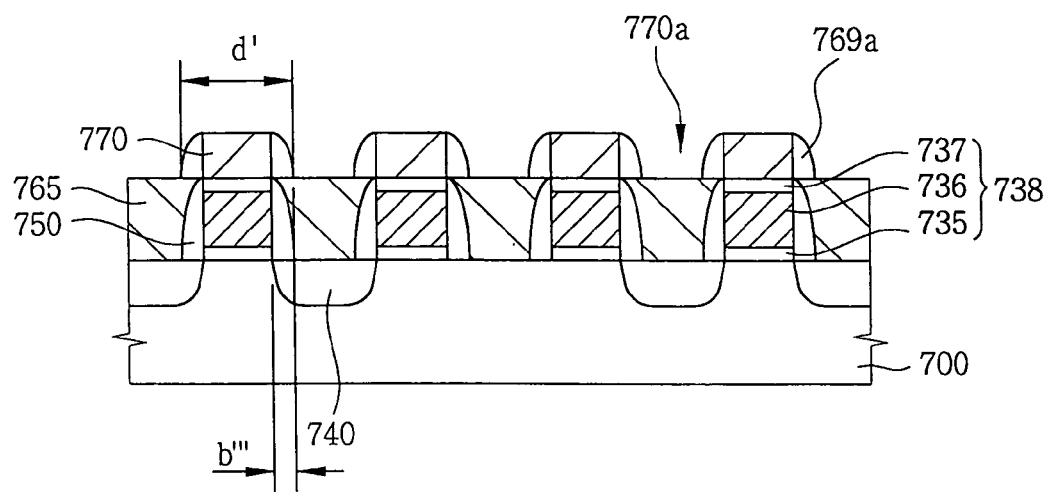

Referring to FIG. 7C, after an insulation material is uniformly coated on the etch stop film pattern 770 and on the first insulation film patterns 765, the coated insulation material is anisotropically etched to form etch stop film spacers 769a on sidewalls of the etch stop film patterns 770, respectively. At this time, a thickness of the etch stop film spacer 769a is adjusted in accordance with a thickness of the coated insulation material. As a result, open regions 770a are formed between the etch stop film spacers 769a to have a dimension which is less than a CD of the semiconductor device.

As the width of the etch stop film spacer 769a is adjusted, an entire width of the etch stop film pattern 770 and the etch stop film spacer 769a becomes a second width d' extended by an interval b'" corresponding to a distance of about 5 to about 35 percent of an interval between the gate electrodes 738 along a horizontal direction.

When widths of the open regions 770a can be achieved using a photolithography process, a structure having a width as wide as entire width of the etch stop film patterns 770 and the etch stop film spacers 769a can be formed to replace with the etch stop film patterns 770 and the etch stop film spacers 769a.

Figure 7D:
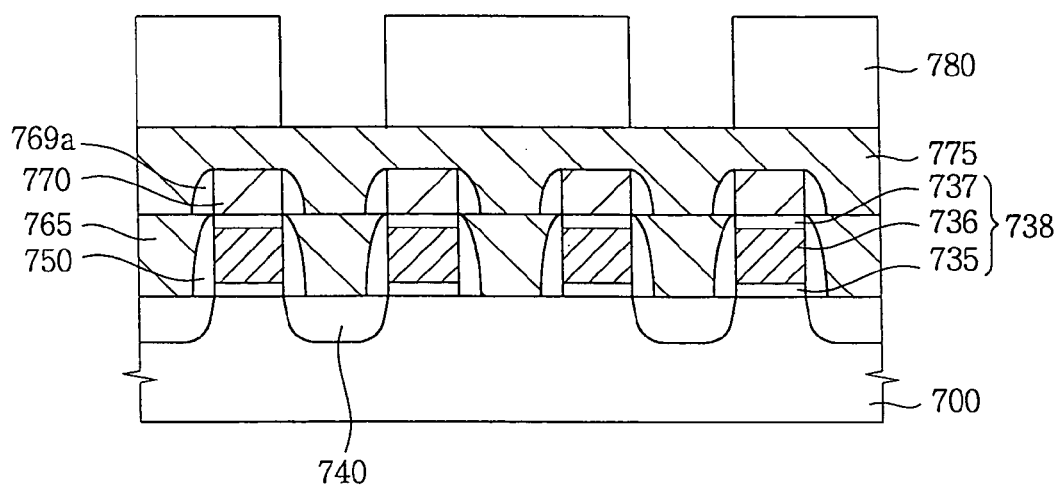

Referring to FIG. 7D, a second insulation film 775 is formed on the etch stop film patterns 770 and the etch stop film spacers 769a. Photoresist patterns (not shown) are formed on the second insulation film 775. The photoresist patterns expose portions of the second insulation film 775 under which the first insulation film patterns 765 are located.

Additionally, the photoresist patterns expose portions of the etch stop film patterns 770 and the etch stop film spacers 769a, respectively.

Figure 7E:
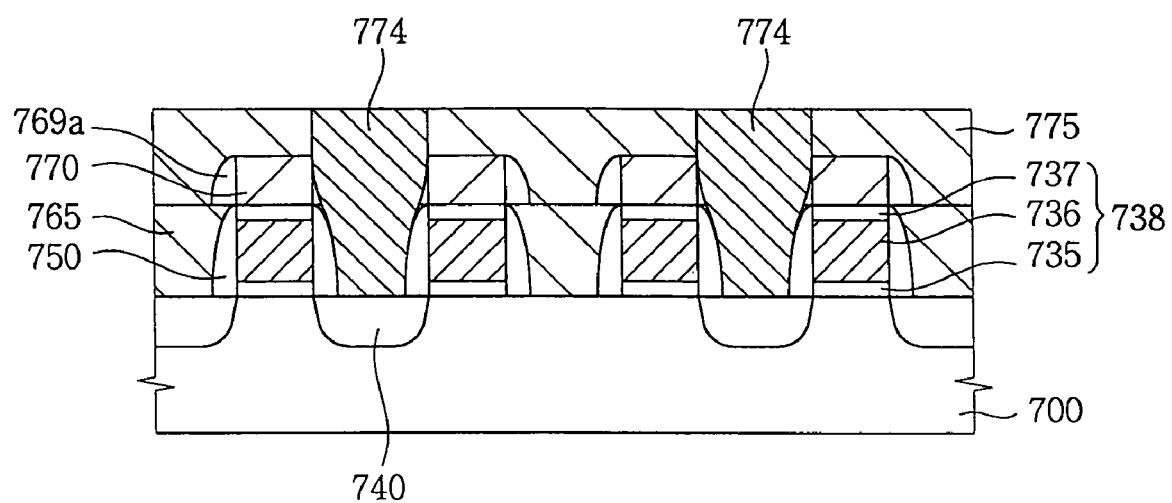

Referring to FIG. 7E, the exposed portions of the second insulation film 775 are etched using the photoresist patterns as etching masks, and the first insulation film patterns 765 are successively etched to form openings exposing the source/drain regions 740. At this time, the second insulation film 775 and the first insulation film pattern 765 have etching selectivities of more than about 10:1 relative to the etch stop film pattern 770, the etch stop film spacer 769a and the gate spacer 750.

After the photoresist patterns are removed using an ashing process and a stripping process, the openings are filled with a conductive film. Then, the conductive film is planarized using a CMP process to form SAC pads 747 in the openings, respectively.

The above method of the present embodiment can be advantageously employed for forming an inter layer dielectric between conductive wirings the bit lines of a semiconductor device. The inter layer dielectric can be easily formed without generations of defects such as voids.

According to embodiments of the present invention, an etch stop film pattern for protecting a conductive pattern is formed after an insulation film is formed. Additionally, the etch stop film pattern has a width which is greater than that of the conductive pattern. Several insulation films are formed in order to insulate an upper conductive pattern and a lower conductive pattern. The insulation film can easily fill up a gap between the conductive patterns without the formation of voids after the gap. Also, the conductive patterns can be electrically insulated from pads formed in adjacent contact holes because the insulation film patterns partially remain in the contact holes. Hence, a failure such as an electrical short can be effectively prevented and a reliability of the semiconductor device can be improved.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method for manufacturing a semiconductor device, comprising:
    forming first spacers on sidewalls of first structures, wherein each one of the first structures comprises; an insulation film pattern formed on a conductive film pattern formed on a semiconductor substrate, wherein the conductive film pattern is formed with a thickness at least four times that of the insulation film pattern;
    forming a first insulation film to cover the first structures including the first spacers and regions between the first structures;
    forming first insulation film patterns filling regions between adjacent ones of the first structures by planarizing the first insulation film until upper faces of the first structures are exposed;
    forming second structures on the first insulation film patterns and on the first structures, wherein each one of the second structures is substantially aligned over at least one of the first structures, such that the second structures expose first portions of the first insulation film patterns, wherein each one of the exposed first portions is spaced from adjacent ones of the first structures by a distance ranging from between about 5 to about 35 percent of a distance separating the adjacent ones of the first structures; and
    forming openings to expose portions of the semiconductor substrate by etching the first portions of the first insulation film patterns using the second structures and the first spacers as an etching mask.

2. The method of claim 1, wherein formation of the second structures comprises:
    forming an etch stop film on the first insulation film patterns and on the first structures;
    forming etch stop film patterns which expose portions of the first insulation film patterns by etching the etch stop film;
    uniformly forming a spacer film on the etch stop film patterns and on the exposed portions of the first insulation film patterns; and
    forming second spacers on sidewalls of the etch stop film patterns by anisotropically etching the spacer film, wherein the second spacers are separated from adjacent ones of the first structures by a distance ranging from about 5 to about 35 percent of the distance separating the adjacent ones of the first structures.

3. The method of claim 1, wherein formation of the second structures comprises:
    forming an etch stop film on the first insulation film patterns and on the first structures;
    forming photoresist patterns on the etch stop film substantially edge aligned over the first structures;
    forming the second structures spaced apart from adjacent ones of the first structures by a distance ranging from between about 5 to about 35 percent of the distance separating the adjacent ones of the first structures by etching the etch stop film using the photoresist patterns as etching masks; and removing the photoresist patterns.

4. The method of claim 1, wherein forming the openings in the first insulation film pattern is performed using an etching process having an etching selectivity relative to the first insulation film of more than about 10:1 relative to the second structures.

5. The method of claim 1, wherein each second structure has a thickness which is less than that of the first structures.

6. A method for manufacturing a semiconductor device, comprising:
    forming first spacers on sidewalls of first structures, wherein each one of the first structures comprises an insulation film pattern and a conductive film pattern stacked on a semiconductor substrate, wherein the conductive film pattern is formed with a thickness at least four times that of the insulation film pattern;
    forming a first insulation film to cover the first structures including the first spacers and regions between the first structures;
    forming first insulation film patterns filling regions between the first structures by planarizing the first insulation film until upper faces of the first structures are exposed;
    forming second structures on the first insulation film patterns and on the first structures, such that the second structures expose first portions of the first insulation film patterns, wherein each one of the exposed first portions is spaced from adjacent ones of the first structures by a distance ranging from between about 5 to about 35 percent of a distance separating the adjacent ones of the first structures;
    forming openings to expose portions of the semiconductor substrate by etching the first portions of the first insulation film patterns using the second structures and the first spacers as an etching mask;

wherein formation of the second structures comprises;

forming an etch stop film on the first insulation film patterns and on the first structures;

forming hard mask patterns on the etch stop film, each one of the hard mask patterns being substantially aligned over at least one of the first structures;

forming second spacers on sidewalls of the hard mask patterns;

etching portions of the etch stop film using the hard mask patterns and the second spacers as an etching mask; and removing the hard mask patterns and the second spacers.

7. The method of claim 6, wherein the first insulation layer comprises at least one selected from a group consisting of; BPSG, a high density plasma (HDP) oxide, a high temperature undoped silicate glass (HTUSG), and a spin-on-dielectric (SOD) material.

8. The method of claims 7, wherein forming the first insulation film patterns comprises planarizing the first insulation layer using at least one of a chemical mechanical polishing (CMP) process and an etch-back process.

9. The method of claim 6, wherein adjacent ones of the hard mask patterns are separated by a distance greater than the distance separating the adjacent ones of the first structures.

10. The method of claim 6, wherein forming the openings in the first insulation film comprises:

etching the first insulation film patterns using an etching process having an etching selectivity relative to the first insulation film patterns of more than about 10:1 relative to the hard mask patterns and second sidewalls.

11. The method of claim 6, wherein the hard mask patterns are formed with a thickness less than that of the first structures.

12. A method for manufacturing a semiconductor device, comprising:

forming first structures comprising a plurality of gate electrode structures, each one of the plurality of gate electrode structures comprising an insulation film pattern serving as an etch end point and formed on a conductive film pattern which is formed on a gate oxide film pattern, wherein the conductive film pattern is formed with a thickness at least four times that of the insulation film pattern, and wherein each one of the plurality of gate electrode structures is separated from adjacent ones of the plurality of gate electrode structures by a first distance;

forming first spacers on sidewalls of each one of the plurality of gate electrode structures;

forming a first insulation film on the plurality of gate electrode structures and first spacers;

forming first insulation film patterns completely filling regions between adjacent ones of the plurality of gate electrodes and their associated first spacers by planarizing the first insulation film using the etch stop point;

forming second structures on the first insulation film patterns, wherein each one of the second structures is substantially edge aligned with at least one of the first spacers, such that the second structures expose portions of the first insulation film patterns having a width ranging from between about 5 to about 35 percent less than the first distance; and forming openings to expose portions of the semiconductor substrate by etching the first portions of the first insulation film pattern using the second structures and the first spacers as an etching mask.

13. The method of claim 12, wherein forming the second structures comprises:

forming an etch stop film on the first insulation film patterns and the first structures;

forming hard mask patterns to expose portions of the etch stop film having a width substantially equal to and overlaying the width of the exposed portions of the first insulation film patterns;

etching the etch stop film using the hard mask patterns as an etching mask; and, removing the hard mask patterns.

14. The method of claim 13, wherein forming the hard mask patterns comprises:

forming a hard mask film on the etch stop film;

patterning the hard mask film into hard mask portions substantially edge aligned with at least one gate electrode structure;

forming second spacers on sidewalls of the hard mask portions.

15. The method of claim 13, wherein the first insulation layer comprises at least one selected from a group consisting of; BPSG, a high density plasma (HDP) oxide, a high temperature undoped silicate glass (HTUSG), and a spin-on-dielectric (SOD) material.

16. The method of claims 15, wherein forming the first insulation film patterns comprises planarizing the first insulation layer using at least one of a chemical mechanical polishing (CMP) process and an etch-back process.

17. The method of claim 13, wherein adjacent ones of the hard mask patterns are separated by a distance greater than the distance separating the adjacent ones of the first structures.

18. The method of claim 16, wherein forming the openings in the first insulation film comprises:

etching the first insulation film patterns using an etching process having an etching selectivity relative to the first insulation film patterns of more than about 10:1 relative to the hard mask patterns and second sidewalls.

19. The method of claim 13, wherein the hard mask patterns are formed with a thickness less than that of the first structures.

* * * * *